United States Patent
KIm et al.

(10) Patent No.: US 9,064,834 B2
(45) Date of Patent: Jun. 23, 2015

(54) DISPLAY DEVICE INCLUDING DISPLAY PANEL HAVING OPENING FOR FLEXIBLE PRINTED CIRCUIT BOARD

(71) Applicant: SAMSUNG DISPLAY CO., LTD., Yongin, Gyeonggi-Do (KR)

(72) Inventors: Min-Ki KIm, Yongin (KR); Hwan-Jin Kim, Yongin (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

(21) Appl. No.: 14/179,929

(22) Filed: Feb. 13, 2014

(65) Prior Publication Data
US 2014/0239277 A1  Aug. 28, 2014

(30) Foreign Application Priority Data
Feb. 25, 2013 (KR) ........................ 10-2013-0019945

(51) Int. Cl.
*H01L 27/32* (2006.01)

(52) U.S. Cl.
CPC ..... *H01L 27/3276* (2013.01); *H01L 2251/5338* (2013.01)

(58) Field of Classification Search
CPC .................. H01L 27/3276; H01L 2251/5338; H01L 2251/30; H01L 2251/50; H01L 2251/53
USPC .............................. 257/40; 345/76
See application file for complete search history.

(56) References Cited

U.S. PATENT DOCUMENTS

| | | | | |
|---|---|---|---|---|
| 6,538,207 | B1* | 3/2003 | Barth | 174/254 |
| 8,456,384 | B2* | 6/2013 | Kim | 345/60 |
| 2006/0244463 | A1* | 11/2006 | Fujita | 324/538 |
| 2007/0128893 | A1* | 6/2007 | Wu et al. | 439/74 |
| 2009/0213292 | A1* | 8/2009 | Park et al. | 349/58 |
| 2011/0037059 | A1* | 2/2011 | Gyoda | 257/40 |
| 2011/0128722 | A1* | 6/2011 | Pan et al. | 362/97.1 |
| 2012/0195024 | A1* | 8/2012 | Kawaguchi et al. | 362/97.2 |

FOREIGN PATENT DOCUMENTS

| | | | |
|---|---|---|---|
| JP | 2008-275894 A | | 11/2008 |
| KR | 10-2007-0013941 | * | 1/2007 |
| KR | 10-2008-0020841 A | | 3/2008 |
| KR | 10-2008-0059836 A | | 7/2008 |
| KR | 10-2012-0052764 A | | 5/2012 |

OTHER PUBLICATIONS

Machine translation of Choi, KR 10-2007-0013941.*

* cited by examiner

*Primary Examiner* — Peter Bradford
(74) *Attorney, Agent, or Firm* — Christie, Parker & Hale LLP (57) ABSTRACT

A display device includes a display panel including a display area to display an image, and a non-display area adjacent to the display area and having an opening; a driver on a rear of the display panel; and a flexible printed circuit board (FPCB) connecting the non-display area to the driver through the opening, and is bent at an angle less than 90 degrees from the non-display area to the driver.

11 Claims, 6 Drawing Sheets

DISPLAY DEVICE INCLUDING DISPLAY PANEL HAVING OPENING FOR FLEXIBLE PRINTED CIRCUIT BOARD

CROSS-REFERENCE TO RELATED APPLICATION

This application claims priority to and the benefit of Korean Patent Application No. 10-2013-0019945, filed in the Korean Intellectual Property Office on Feb. 25, 2013, the entire content of which is incorporated herein by reference.

BACKGROUND

1. Field

Aspects of embodiments of the present invention relate generally to a display device.

2. Description of the Related Art

A display device is an apparatus to display an image and, recently, an organic light emitting diode (OLED) display device is getting attention.

Since the organic light emitting diode display device has its own light emitting characteristic and does not require a separate light source, which is different from a liquid crystal display (LCD) device, it is possible to reduce the thickness and weight of OLED display devices compared to LCD devices. In addition, the organic light emitting diode display device represents high-quality characteristics, such as lower power consumption, higher luminance, higher reaction speed, and the like, when compared to other display devices.

A display device may include a display panel to display an image, a driver located at a rear or front of the display panel to supply a driving signal to the display panel, and a flexible printed circuit board (FPCB) to connect the display panel to the driver. Here, the driver is located at the rear or front of display panel, and the FPCB includes substantially a 180-degree bent portion. However, such a display device has a problem in that the FPCB may be unintentionally separated from the display panel by the tension applied on the FPCB due to 180-degree bending of the FPCB.

The above information disclosed in this Background section is only for enhancement of understanding of the background of the present invention and therefore it may contain information that does not form the prior art that is already known in this country to a person of ordinary skill in the art.

SUMMARY

Aspects of embodiments of the present invention relate generally to a display device and, more particularly, to a display device including a flexible printed circuit board (FPCB) connected to a display panel of the display device. Embodiments of the present invention provide for a display device capable of reducing or minimizing tension applied to an FPCB.

According to an embodiment, a display device is provided, which includes a display panel including a display area to display an image, and a non-display area adjacent to the display area and having an opening; a driver on a rear of the display panel; and a flexible printed circuit board (FPCB) connecting the non-display area to the driver through the opening, and being bent at an angle less than 90 degrees from the non-display area to the driver.

The display area may include a display unit to display the image, the non-display area may include a pad unit connected to the display unit and on a front of the display panel, and the FPCB may connect the pad unit to the driver.

The display unit may include an organic light emitting device.

The opening may be between the display unit and the pad unit.

The opening may be at a periphery of the non-display area along an imaginary line crossing the non-display area.

The opening may include a first sub-opening at one side of the non-display area, and a second sub-opening at another side of the non-display area.

The FPCB may include a first sub-FPCB connecting the pad unit to the driver through the first sub-opening, and a second sub-FPCB connecting the pad unit to the driver through the second sub-opening.

The opening may be located at an interior of the non-display area along an imaginary line crossing the non-display area.

The opening may be a hole in the display panel.

The driver may be in a chip, and the FPCB may be between the driver and the display panel.

The opening may be wider in width than that of the FPCB.

According to some embodiments, a display device is provided to reduce or minimize the tension applied to an FPCB.

DETAILED DESCRIPTION

Various embodiments will now be described more fully hereinafter with reference to the accompanying drawings to more fully convey the scope of the present invention to one skilled in the art. The present invention may, however, be embodied in different forms and should not be construed as limited to the embodiments set forth herein.

In order to more clearly explain embodiments of the present invention, some portions regarded as more illustrative in nature may be omitted, and the same reference numerals are used to denote the same component throughout the specification. For example, among various described embodiments, the first embodiment may be described as a representative in which the same reference numerals are used in components with the same configuration, and other embodiments different from the first embodiment may only be described in terms of differences from the first embodiment.

Further, for the convenience of description, the size and thickness of each configuration shown in the drawings may be exaggerated for clarity, and the present invention shall be not limited thereto. For example, in the drawings, the thickness of layers, films, panels, regions, etc., may be exaggerated for clarity. For instance, in the drawings, for the convenience of description, a portion of a layer and a thickness of a region may be exaggerated. Further, it will be understood that when a portion of a layer, film, region, plate, or the like is referred to as being "on" another portion, it can be directly on the other portion, or one or more intervening portions may be present.

In addition, unless explicitly described to the contrary, the word "comprise" and variations such as "comprises" or "comprising," will be understood to imply the inclusion of stated elements but not the exclusion of any other elements. Further, throughout the specification, the term "above" is referred to as encompassing both an orientation of above or below, and it doesn't mean that the term "above" should be referred to an orientation of above, with reference to the direction of gravity.

Furthermore, in the accompanying drawing, an active matrix (AM)-type organic light emitting diode display device of a 2Tr-1Cap structure having two thin film transistors TFT and one capacitor in one pixel is illustrated, but the present invention is not limited thereto. Thus, the organic light emitting diode display device may include three or more thin film transistors and two or more capacitors in one pixel, and may be further provided with separate wires to form a variety of structures. Here, the pixel is referred to as the smallest unit to display an image, and the organic light emitting diode display device displays the image through a plurality of pixels.

As used herein, the term "and/or" includes any and all combinations of one or more of the associated listed items. Further, the use of "may" when describing embodiments of the present invention refers to "one or more embodiments of the present invention." In a similar fashion, the use of example language, such as "for example," "such as," and "e.g." when describing embodiments of the present invention refers to "one or more embodiments of the present invention" for each of the corresponding items listed. In addition, the use of alternate language, such as "or," when describing embodiments of the present invention refers to "one or more embodiments of the present invention" for each corresponding item listed, while the use of combinational language such as "and/or" or "one or more" refers to "one or more embodiments of the present invention" for every combination of one or more of the corresponding items listed.

Hereinafter, referring to FIGS. 1 to 4, a display device 1000 according to the first embodiment will be described.

Figure 1:
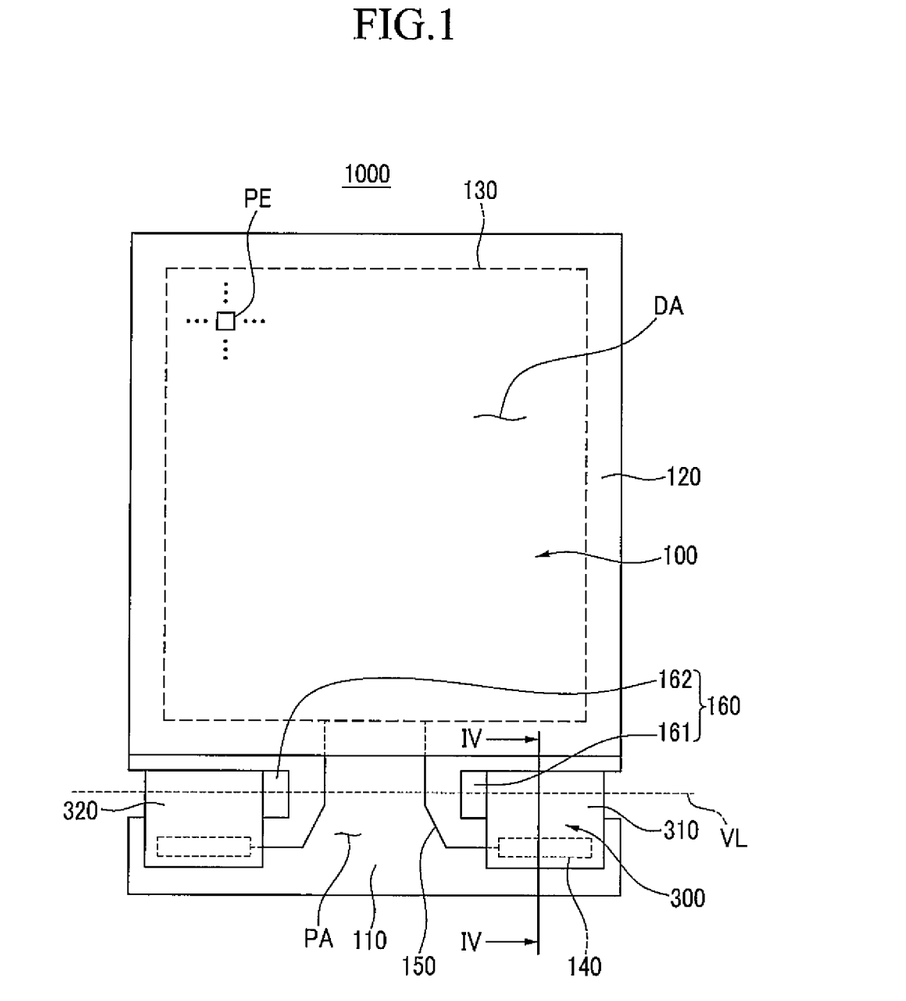
FIG. 1 is a top plan view illustrating a display device according to a first embodiment.

FIG. 1 is a top plan view illustrating the display device 1000. As shown in FIG. 1, the display device 1000 includes a display panel 100, a driver 200 (shown in FIG. 4) and a flexible printed circuit board (FPCB) 300. In addition, the FPCB 300 includes a first sub-FPCB 310 on one side (right side) of the display device 1000 and a second sub-FPCB 320 on another side (left side) of the display device 1000.

The display panel 100 includes a first substrate 110 and a second substrate 120 that are adhered to each other and sealed to produce a display area DA and a non-display area PA adjacent to the display area DA. Each of the first substrate 110 and the second substrate 120 may include at least one or more of inorganic materials such as glass, organic materials that contain polymers (such as polyethyleneterephthalate, polyimide, polycarbonate, epoxy, polyethylene, polyacrylate or the like), or metals, and may have flexible characteristics.

The display area DA includes a display unit 130 to display an image with a plurality of pixels PE, wherein each pixel PE is formed with an organic light emitting device 70 (shown in FIG. 2) to emit light. That is, the display area DA is an area to display an image using light emitted from each pixel PE.

According to the first embodiment, the display area DA of the display device 1000 may include a display unit 130 with the organic light emitting device. However, according to another embodiment, the display area may include a display unit 130 to display an image using a liquid crystal, plasma, or an electronic ink.

The non-display area PA is located adjacent to the display area DA. For example, the non-display area PA includes that portion of the first substrate 110 that is exposed (that is, is not covered by the second substrate 120) and may be one area. The non-display area PA includes a pad unit 140 connected to the display unit 130 and disposed on the front of the display panel 100. The non-display area PA further includes an opening 160 between the pad unit 140 and the display unit 130.

The pad unit 140 is connected to display unit 130 via an interconnection wire 150. In FIG. 1, the pad unit 140 is shown as two separate areas, each with a corresponding interconnection wire 150 connecting the pad unit 140 to the display unit 130. Each of the interconnection wires 150 is shown as a single interconnection wire. However, there may be one or more pad units 140, and each of the pad units 140 may be formed as a plurality of terminals, and each of the interconnection wires 150 may be formed as a plurality of interconnection wires connected to respective ones of the plurality of terminals.

The opening 160 is located between the display unit 130 and the pad unit 140 and formed as an opened area. The opening 160 may include a plurality of openings or sub-openings. In FIG. 1, the opening 160 is located at a periphery of the non-display area PA along an imaginary line VL horizontally crossing the non-display area PA of the display panel 100 and includes a first sub-opening 161 located at one side (right side) of the non-display area PA and a second sub-opening 162 located at another side (left side) of the non-display area PA. Each of the first sub-opening 161 and the second sub-opening 162 may be formed by cutting (for example, cutting out side portions or notches out of) the first substrate 110.

Hereinafter, referring to FIGS. 2 and 3, an example structure of the pixel PE included in the display device 1000 will be described in more detail.

Figure 2:
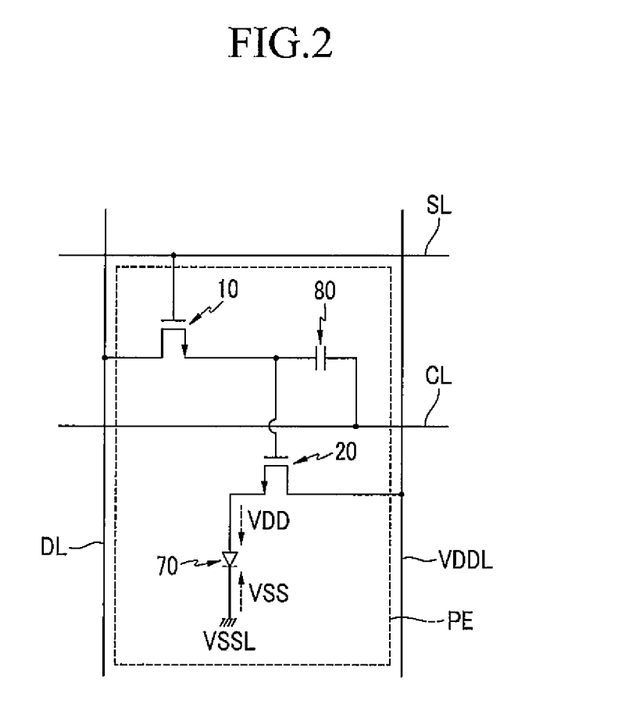
FIG. 2 is a circuit diagram illustrating an example pixel of the display device of FIG. 1.

FIG. 2 is a circuit diagram illustrating an example pixel PE of the display device 1000 of FIG. 1. As shown in FIG. 2, in the display panel 100 included in the display device 1000, one pixel PE has a 2Tr-1Cap structure including an organic light emitting device (for example, an organic light emitting diode) 70, two thin film transistor TFTs 10 and 20 and one capacitor 80. However, the present invention is not limited thereto. Thus, the display device 1000 may include three or more thin film transistors and two more capacitors in one pixel PE and may be further provided with separate wires to form a variety of structures. As described above, the thin film transistors and capacitors that are additionally formed may be a configuration of a compensation circuit.

The compensation circuit improves uniformity of the organic light emitting device 70 formed for each pixel PE to suppress generating of variation in display quality. The compensation circuit may include two to eight thin film transistors.

The organic light emitting device 70 includes an anode electrode (which is a hole injection electrode), a cathode electrode (which is electron injection electrode), and an organic light emitting layer disposed between the anode electrode and the cathode electrode.

The one pixel PE includes a first thin film transistor 10 and a second thin film transistor 20. The first thin film transistor 10 and the second thin film transistor 20 each include a gate electrode, a semiconductor layer, a source electrode, and a drain electrode.

FIG. 2 shows a capacitor line CL together with a gate line SL, a data line DL, and a common power line VDDL for supplying a first power VDD. However, the pixel PE of the display panel 100 included in the display device 1000 is not limited to the structure shown in FIG. 2. For example, the capacitor line CL may be omitted in some cases.

The data line DL is connected to the source electrode of the first thin film transistor 10, and the gate line SL is connected to the gate electrode of the first thin film transistor 10. In addition, the drain electrode of the first thin film transistor 10 is connected to the capacitor line CL through the capacitor 80. Further, a node is formed between the drain electrode of the first thin film transistor 10 and the capacitor 80 such that the gate electrode of the second thin film transistor 20 is connected. The source electrode of the second thin film transistor 20 is connected to the common power line VDDL, and the drain electrode of the second thin film transistor 20 is connected to the anode electrode of the organic light emitting device 70.

The first thin film transistor 10 is used as a switch to select the pixel PE to emit light. When the first thin film transistor 10 is turned on for a moment, the capacitor 80 is charged. At this time, the charge amount that is charged to the capacitor 80 is proportional to a potential of a voltage applied from the data line DL. In addition, when the first thin film transistor 10 is turned off, then when a voltage input to the capacitor line CL is increased in one frame cycle, the gate potential of the second thin film transistor 20 is increased accordingly based on the potential charged to the capacitor 80 with the increased voltage level applied through the capacitor line CL. Further, the second thin film transistor 20 is turned on when the gate potential exceeds the threshold voltage. In this case, a first power VDD, which is a driving power applied to the common power line VDDL from a driver 200 to be described later, is applied to the anode electrode of the organic light emitting device 70 through the second thin film transistor 20.

In addition, the cathode of the organic light emitting device 70 is applied with a second power VSS as supplied by a second power line VSSL, which is a driving power applied from the driver 200, and the organic light emitting device 70 emits light by the first power VDD applied to the anode electrode through the second thin film transistor 20 and the second power VSS applied to the cathode electrode of the organic light emitting device 70.

The configuration of such a pixel PE is not limited to the foregoing, and many variations are possible within the range that can be easily carried out by those skilled in the art.

Figure 3:
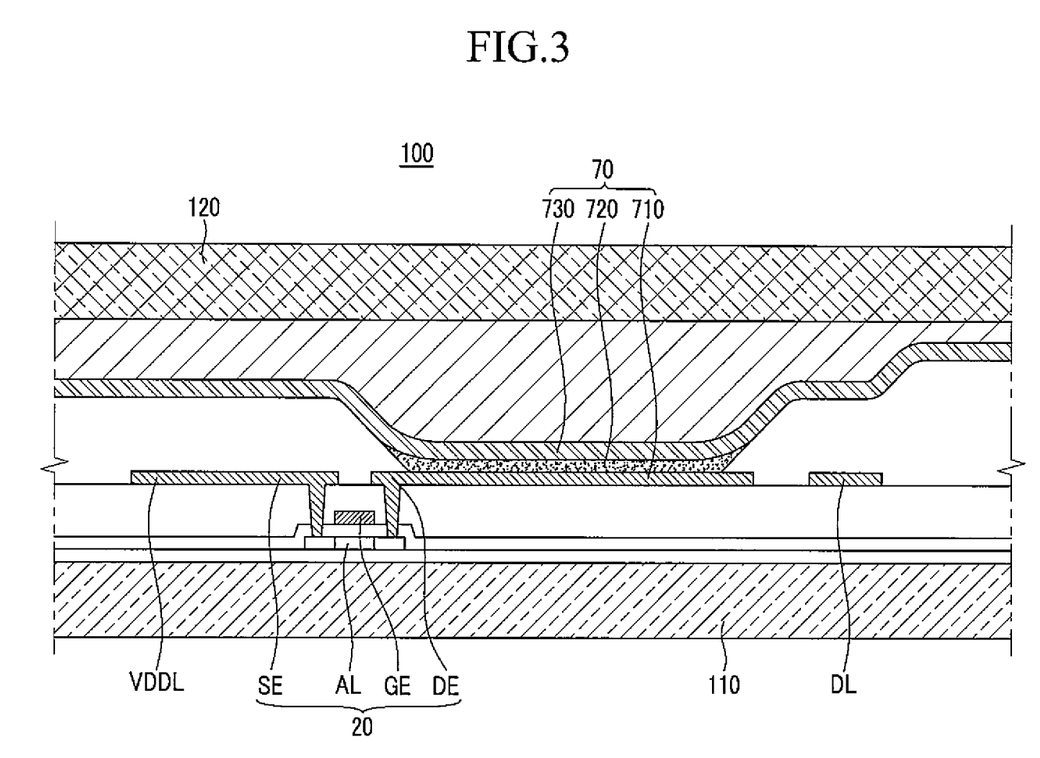
FIG. 3 is a cross-sectional view illustrating an example portion of the pixel of FIG. 2 and a display panel of the display device of FIG. 1.

FIG. 3 is a cross-sectional view illustrating an example portion of the pixel PE of FIG. 2 and the display panel 100 of the display device 1000 of FIG. 1. In FIG. 3, a structure of the second thin film transistor 20 and the organic light emitting device 70 according to the first embodiment is mainly illustrated.

As shown in FIG. 3, the second thin film transistor 20 includes a semiconductor layer AL, a gate electrode GE, a source electrode SE, and a drain electrode DE.

The second thin film transistor 20 receives the first power VDD (which is a driving power for light-emitting the organic light emitting device 70 in the pixel PE selected) from the common power line VDDL, and applies the received first power VDD to a first electrode 710 of the organic light emitting device 70 through the source electrode SE, the semiconductor layer AL, and the drain electrode DE. The first electrode 710 of the organic light emitting device 70 extends from the drain electrode DE, the drain electrode DE and the first electrode 710 being connected to each other.

The organic light emitting device 70 includes the first electrode 710, an organic light emitting layer 720 on the first electrode 710, and a second electrode 730 on the organic light emitting layer 720.

The first electrode 710 is an anode electrode (which is a hole injection electrode), and the second electrode 730 is a cathode electrode (which is an electron injection electrode). However, the first embodiment is not necessarily limited to such a configuration. According to other embodiments of the display device 1000, the first electrode 710 may be a cathode, and the second electrode 730 may be an anode.

When the first power VDD (which is a driving power from the driver 200) is supplied to the first electrode 710 by the second thin film transistor 20, and the second power VSS (which is a driving power from the driver 200) is supplied to the second electrode 730), holes and electrons from the first electrode 710 and the second electrode 730, respectively, are injected into the organic light emitting layer 720. In this case, when excitons formed by the combining of the holes and the electrons injected into the organic light emitting layer 720 fall from an excited state to a ground state, light emits from the organic light emitting layer 720. In addition, each of the first electrode 710 and the second electrode 730 may include a light-transmitting conductive material of a single layer or multi layer that contains one or more of indium tin oxide (ITO), indium zinc oxide (IZO), and the like, or a light-reflecting conductive material of a single layer or multi layer that contains one or more of aluminum (Al), silver (Ag), and the like.

The organic light emitting layer 720 is a layer in which the holes and the electrons injected from first electrode 710 and the second electrode 730, respectively, are combined, and light such as red light, green light, blue light, or the like, can be emitted.

In one embodiment, the organic light emitting layer 720 includes a plurality of emission layers to emit red light, green light, and blue light so that white light can be emitted. In this case, a color filter changing a wavelength of the light being emitted by the organic light emitting layer 720 may be disposed.

Thus, the organic light emitting device 70 of the display panel 100 is supplied with the driving power from the driver 200 through the FPCB 300, and the organic light emitting device 70 emits light by the supplied driving power.

Figure 4:
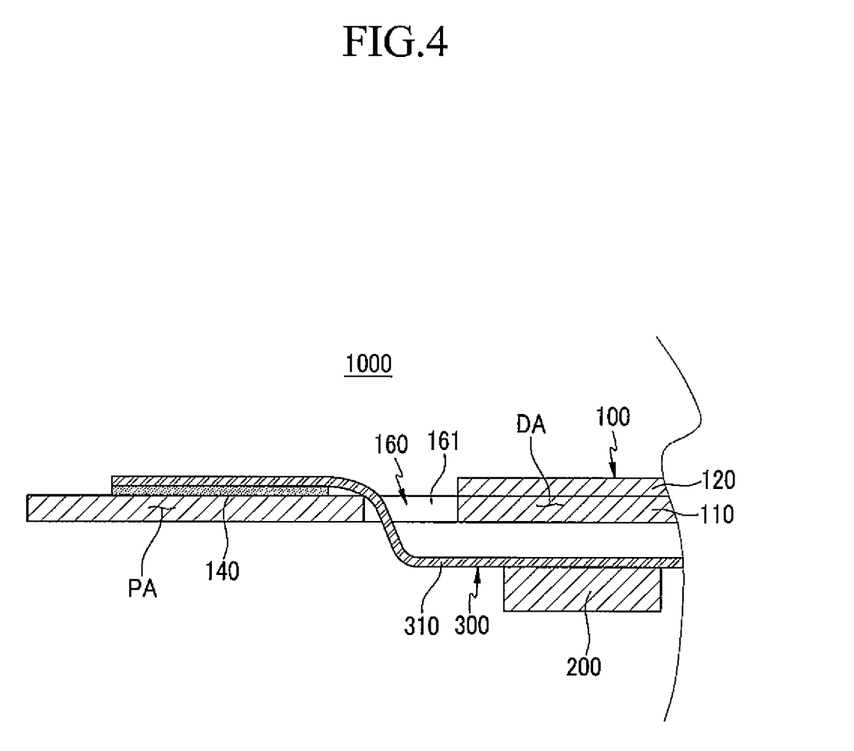
FIG. 4 is a cross-sectional view taken along a line IV-IV in FIG. 1.

Referring to FIGS. 1 and 4, the driver 200 and the FPCB 300 will be described in more detail. FIG. 4 is a cross-sectional view taken along a line TV-IV in FIG. 1.

As shown in FIGS. 1 and 4, the driver 200 may be in a chip and is disposed on the rear of the display panel 100. The driver 200 is connected to the FPCB 300 to supply a driving signal for displaying an image to a display unit 130 of the display panel 100 through the FPCB 300. The FPCB 300 is located between the driver 200 and the display panel 100.

The driver 200 can supply a gate power, a data power, a first power VDD (which is a common power), and a second power VSS (which is a cathode power), to a gate line SL, a data line DL, a common power line VDDL, and a second electrode 730, respectively, of the display panel 100, through the FPCB 300. Specifically, the driver 200 supplies a driving power to the organic light emitting device 70. As described above, the driving power from the driver 200 includes the first power VDD and the second power VSS. The first power VDD is supplied to a first electrode 710, which is an anode electrode of the organic light emitting device 70, and the second power VSS is supplied to a second electrode 730, which is a cathode electrode of the organic light emitting device 70.

In the first embodiment, the FPCB 300 is located between the driver 200 and the display panel 100. However, in another embodiment, when the driver 200 is formed as a type including a plurality of driving integrated circuits (ICs) and a printed circuit board (PCB), the FPCB 300 may be connected to a pad formed on the printed circuit board and may not be located between the driver 200 and the display panel 100.

The FPCB 300 connects the driver 200 to the pad unit 140 included in the non-display area PA of the display panel 100, and is extended from the pad unit 140 of the non-display area PA to the driver 200 through the opening 160. The FPCB 300 may be a tape carrier package, with one end of the FPCB 300 connected to the pad unit 140 of the display panel 100, and the other end of the FPCB connected to the driver 200, using a connecting member such as an anisotropic conductive film (ACF) or the like.

In FIG. 1, the FPCB 300 includes a first sub-FPCB 310 connecting the pad unit 140 (for example, the right pad unit 140) to the driver 200 through a first sub-opening 161, and a second sub-FPCB 320 connecting the pad unit 140 (for example, the left pad unit 140) to the driver 200 through a second sub-opening 162. The first sub-FPCB 310 and the second sub-FPCB 320 may be connected to the same driver 200, or to different drivers 200.

In addition, the opening 160 is formed to have a wider width than that of the FPCB 300. Specifically, the first sub-opening 161 is formed to have a wider width along the imaginary line VL than that of the first sub-FPCB 310, and the second sub-opening 162 is formed to have a wider width along the imaginary line VL than that of the second sub-FPCB 320. As a result, the FPCB 300 going through the opening 160 is extended from the pad unit 140 to the driver 200, without any interference caused by the opening 160.

As described above, in the display device 1000 according to the first embodiment, the FPCB 300 connecting the display panel 100 to the driver 200 is bent through the opening 160 from the pad unit 140 of the display panel 100 and extended to the driver 200. Thus, because the bent portion of the FPCB 300 is bent at an angle of less than 90 degrees, the tension applied to the FPCB 300 by bending is reduced or minimized to lessen or minimize the possibility that the FPCB 300 will be separated from the pad unit 140 of the display panel 100 or from the driver 200 due to the tension.

In addition, in the display device 1000 according to the first embodiment, the FPCB 300 is extended from the display panel 100 to the driver 200 through the opening 160. Thus, an additional space (or thickness) in which the FPCB 300 is bent at the display panel 100 will be not required. In other words, the display device 1000 that is provided has a flatter profile and is generally slimmer than comparable display devices.

Further, in the display device 1000 according to the first embodiment, the FPCB 300 is bent through the opening 160 and extended from the display panel 100 to the driver 200. Thus, because the bent portion of the FPCB 300 is blocked or protected by the display panel 100, it is possible to suppress that the FPCB 300 from being damaged due to external interferences. In other words, the display device 1000 is provided in which faultiness due to external interferences is suppressed.

In addition, in the display device 1000 according to the first embodiment, the FPCB 300 is extended from display panel 100 to the driver 200 through the opening 160, and only the FPCB 300 is located between the driver 200 and the display panel 100. Thus, because the driver 200 is not in the form of chips between the display panel 100 and the FPCB 300, an additional cushion for preventing interferences between the driver 200 and the display panel 100 is not required between the display panel 100 and the FPCB 300, so the entire thickness of the display device 1000 can be implemented in a slim package.

Furthermore, in the display device 1000 according to the first embodiment, the opening 160 includes the first sub-opening 161 and the second sub-opening 162, and the FPCB 300 includes the first sub-FPCB 310 going through the first sub-opening 161 and the second sub-FPCB 320 going through the second sub-opening 162. Thus, a variety of driving powers supplied to the display unit 130 can be supplied to a plurality of paths through the first sub-FPCB 310 and the second sub-FPCB 320.

Hereinafter, referring to FIGS. 5 and 6, a display device according to a second embodiment will be described. In general, only distinguishing features from the first embodiment will be described, and explanation of the same parts as in the first embodiment may not be repeated. Further, in the second embodiment, for the convenience of description, the same constituent elements will be described using the same reference numbers as the first embodiment.

Figure 5:
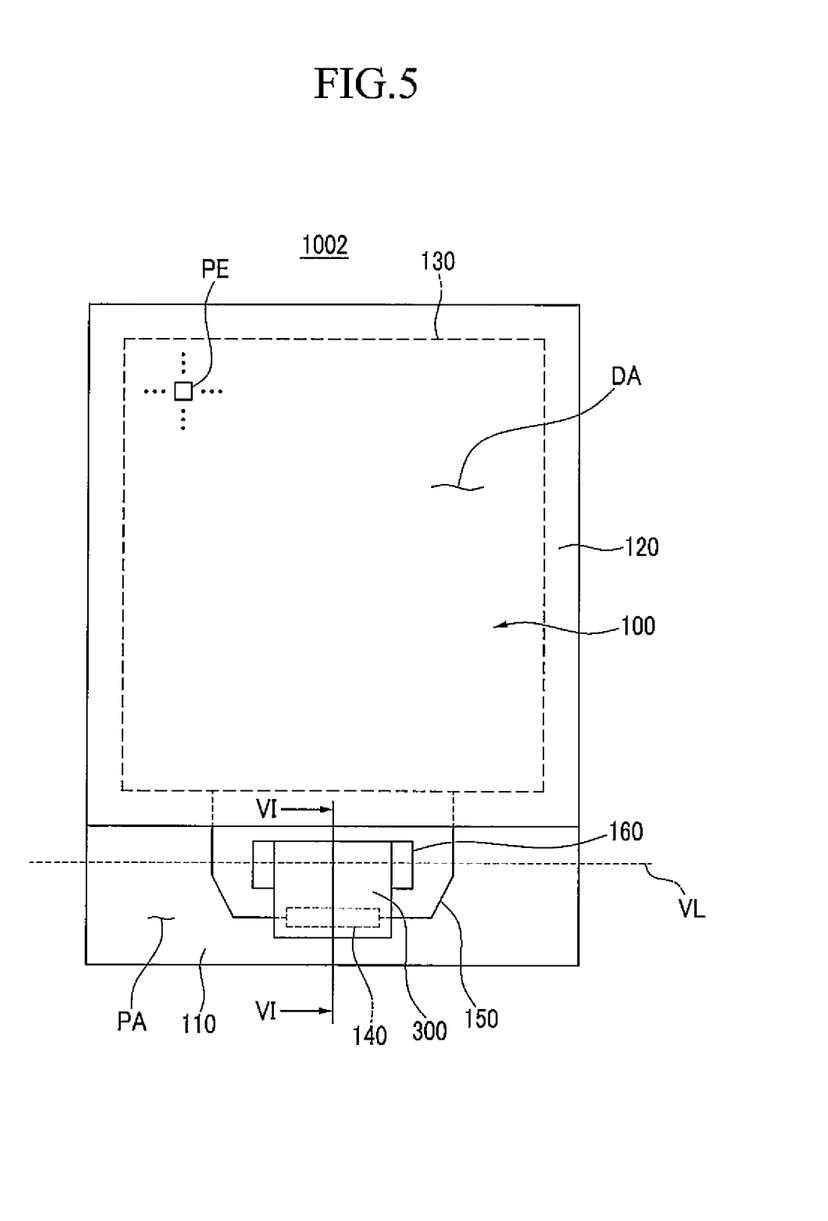
FIG. 5 is a top plan view illustrating a display device according to a second embodiment.

FIG. 5 is a top plan view illustrating a display device 1002 according to the second embodiment. FIG. 6 is a cross-sectional view taken along a line VI-VI in FIG. 5.

Figure 6:
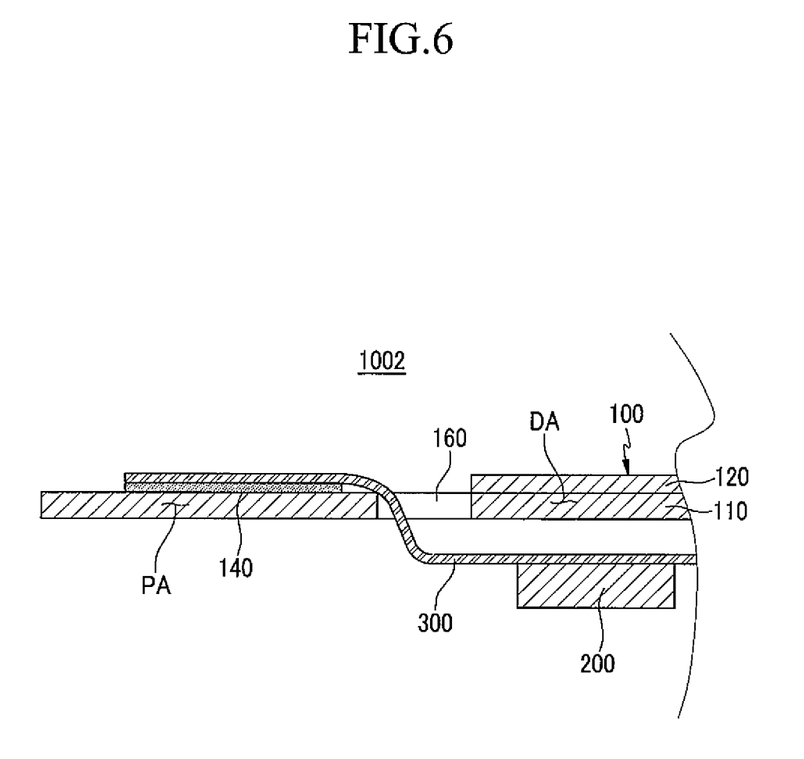
FIG. 6 is a cross-sectional view taken along a line VI-VI in FIG. 5.

As shown in FIGS. 5 and 6, in the display device 1002, the opening 160 is located at an interior (for example, a center) of the non-display area PA along the imaginary line VL crossing the non-display area PA of the display panel 100 (for example, between opposite sides of the non-display area PA), and formed in the first substrate 110 of the display panel 100 in the form of a hole surrounded by the first substrate 110. The FPCB 300 is extended from the pad unit 140 to the driver 200 through the opening 160 formed in the form of the hole.

As described above, in the display device 1002 according to the second embodiment, the FPCB 300 connecting the display panel 100 to the driver 200 is bent through the opening 160 and extended to the driver 200. Thus, because the bent portion of the FPCB 300 is bent at an angle of fewer degrees (such as less than 90 degrees), the tension applied to the FPCB 300 by bending is reduced or minimized to lessen or minimize the chance that the FPCB 300 will be separated from the pad unit 140 of the display panel 100 or from the driver 200 due to the tension.

In addition, in the display device 1002, the FPCB 300 is bent through the opening 160 formed in the form of the hole and extended from the display panel 100 to the driver 200. Thus, because all sides of the bent portion of the FPCB 300 are surrounded by the first substrate 110 of the display panel 100 where the FPCB extends through the opening 160 in the second embodiment, it is possible to further suppress the FPCB 300 from external damage. That is, the display device 1002 helps suppress faults due to external interference.

While the present invention has been described in connection with example embodiments, the invention is not limited to these embodiments, but, on the contrary, is intended to include various modifications within the spirit and scope of the appended claims and their equivalents, as would be apparent to one of ordinary skill in the art.

DESCRIPTION OF SOME SYMBOLS display area DA, non-display area PA, display panel 100, driver 200, opening 160, flexible printed circuit board (FPCB) 300

What is claimed is:

1. A display device comprising:
 a display panel having a front and a rear, the front including a display area to display an image and a non-display area adjacent to the display area, the front and rear sharing an opening through the display panel corresponding to the non-display area;
 a driver on the rear of the display panel corresponding to the display area; and a flexible printed circuit board (FPCB) connecting the non-display area to the driver through the opening, and being bent at an angle less than 90 degrees from the non-display area to the driver.

2. The display device of claim 1, wherein the display area includes a display unit to display the image, the non-display area includes a pad unit connected to the display unit and on the front of the display panel, and the FPCB connects the pad unit to the driver.

3. The display device of claim 2, wherein the display unit includes an organic light emitting device.

4. The display device of claim 2, wherein the opening is between the display unit and the pad unit.

5. The display device of claim 4, wherein the opening is at a periphery of the non-display area along an imaginary line crossing the non-display area.

6. The display device of claim 5, wherein the opening includes:

a first sub-opening at one side of the non-display area; and a second sub-opening at another side of the non-display area.

7. The display device of claim 6, wherein the FPCB includes:

a first sub-FPCB connecting the pad unit to the driver through the first sub-opening; and a second sub-FPCB connecting the pad unit to the driver through the second sub-opening.

8. The display device of claim 4, wherein the opening is located at an interior of the non-display area along an imaginary line crossing the non-display area.

9. The display device of claim 8, wherein the opening is a hole in the display panel.

10. The display device of claim 1, wherein the driver is in a chip, and the FPCB separates the driver from the rear of the display panel.

11. The display device of claim 1, wherein the opening is wider in width than that of the FPCB.

* * * * *